United States Patent [19]

Van Geelen et al.

[11] Patent Number: 4,966,614
[45] Date of Patent: Oct. 30, 1990

[54] METHOD OF AND DEVICE FOR MANUFACTURING OPTICAL FIBERS

[75] Inventors: Andreas N. Van Geelen; Jan G. J. Peelen; Hendrik Venhuizen, all of Eindhoven, Netherlands

[73] Assignee: U.S. Philips Corp., New York, N.Y.

[21] Appl. No.: 158,081

[22] Filed: Feb. 16, 1988

Related U.S. Application Data

[63] Continuation of Ser. No. 918,590, Oct. 9, 1986, abandoned, which is a continuation of Ser. No. 726,175, Apr. 23, 1985, abandoned, which is a continuation of Ser. No. 527,049, Aug. 29, 1983, abandoned.

[30] Foreign Application Priority Data

Jun. 15, 1983 [NL] Netherlands .......................... 8302127

[51] Int. Cl.$^5$ ..................... C03B 37/025; C03C 17/02
[52] U.S. Cl. ......................... 65/3.12; 65/3.2; 65/18.2; 219/121.36; 118/620; 427/39; 427/167; 427/237
[58] Field of Search .................... 65/3.2, 3.12, 18.2; 427/39, 163, 167, 237; 219/121 PL; 118/620

[56] References Cited

U.S. PATENT DOCUMENTS

| Re. 30,635 | 6/1981 | Kuppers | 427/38 |
|---|---|---|---|
| 4,217,027 | 5/1980 | MacChesney et al. | 350/96.3 |
| 4,312,653 | 3/1982 | Schneider et al. | 65/3.12 |
| 4,314,833 | 2/1982 | Küppers | 65/3.12 |
| 4,349,373 | 9/1982 | Sterung et al. | 65/3.20 |
| 4,405,655 | 9/1983 | Tuin | 427/39 |
| 4,576,662 | 3/1986 | Jung | 65/13 |

FOREIGN PATENT DOCUMENTS

| 2907833 | 9/1980 | Fed. Rep. of Germany | 65/3.12 |
|---|---|---|---|
| 2930781 | 2/1981 | Fed. Rep. of Germany | 65/3.12 |
| 2008773 | 2/1982 | Japan | 65/3.12 |
| 2067181 | 7/1981 | United Kingdom | 65/3.12 |

Primary Examiner—David Simmons
Assistant Examiner—Lori Johnson
Attorney, Agent, or Firm—Ernestine C. Bartlett

[57] ABSTRACT

In the P.C.V.D. process, in principal the quartz tube need not be rotated during the deposition of the glass layers. However, it has been found in practice that an improvement in the quality of the glass fibers can be obtained if the quartz tube is rotated regularly over an angle of 360°/n. n is preferably equal to an integer from 2 to 12.

4 Claims, 2 Drawing Sheets

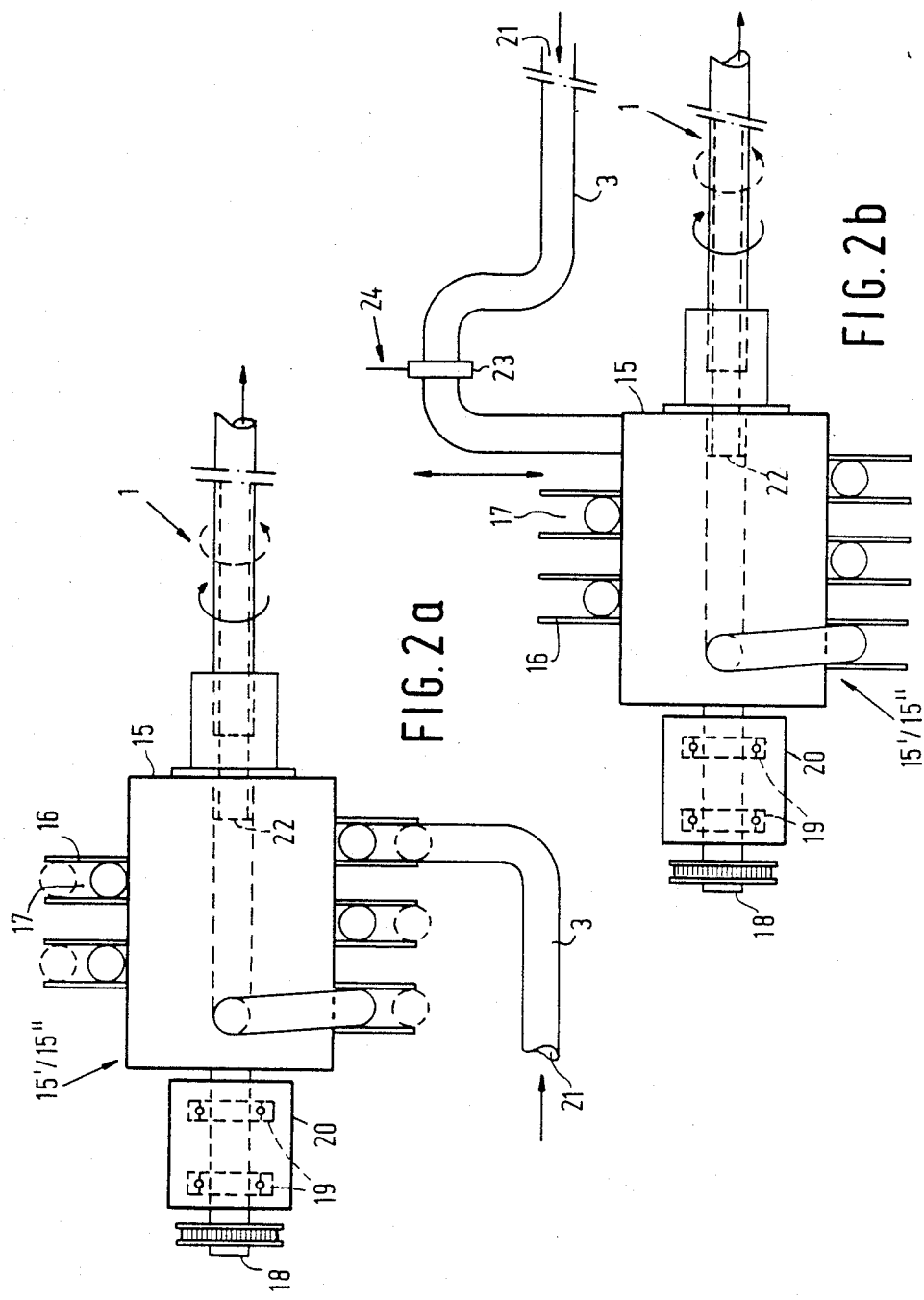

METHOD OF AND DEVICE FOR MANUFACTURING OPTICAL FIBERS

This is a continuation of application Ser. No. 918,590, filed Oct. 9, 1986, now abandoned which is a continuation of Ser. No. 726,175, filed Apr. 23, 1985 now abandoned which is a continuation of Ser. No. 527,049, filed Aug. 29, 1983 now abandoned.

BACKGROUND OF THE INVENTION

The invention relates to a method of manufacturing optical fibers. In the method, glass layers are deposited on the inside of a glass tube which is heated to a temperature between 1100° and 1300° C. The glass layers are deposited by passing a reactive gas mixture through the tube at a pressure between 0.13 and 13.33 kPa, and reciprocating a plasma in the interior of the tube. After a sufficient number of glass layers have been deposited, the tube is collapsed to form a solid preform. The preform is then drawn into an optical fiber. Glass is to be understood to mean in this connection also synthetic glass and amorphous quartz obtained from quartz crystals by fusion (i.e. fused silica and quartz glass), when doped or undoped.

The manufacture of optical fibers by this method is disclosed, inter alia, in U.S. Pat. Nos. RE 30,635 and 4,314,833. In the art, this method is known as the "nonisothermal plasma C.V.D." process (nonisothermal P.C.V.D.). In this method, glass layers are deposited directly from the gaseous phase on the inner wall of the glass tube (a heterogeneous reaction). The formation of glass soot in the gaseous phase is avoided (see in this connection, in particular, U.S. Pat. No. 4,314,833).

In principle it is not necessary in this method to rotate the glass tube so as to ensure a rotationally symmetrical glass deposition. In practice, the diffusion in the gaseous phase of charged particles formed in the plasma (ions, excited atoms and the like) to the glass wall does not seem to be biased by gravity. This in contrast with a so-called homogeneous deposition process in which glass particles are formed in the gaseous phase; the deposition of the glass particles is indeed biased by gravity.

In methods in which glass particles are formed in the gaseous phase and are deposited on the interior of a tube, the tube is rotated continuously at a rather high speed so as to ensure a rotationally symmetrical glass deposition. (See, for example, U.S. Pat. No. 4,217,027, which describes the M.C.V.D. process, in which the speed of rotation is 100 rpm). The gas pressure in these deposition processes usually is equal to or larger than atmospheric pressure. Therefore no particularly high requirements need be imposed upon the rotation couplings with respect to their gastightness.

In industrial production of optical fibers according to the P.C.V.D. process, it sometimes appears that the deposited glass layers are sometimes not rotationally symmetric. This is detrimental because nonsymmetrical deposition of the glass layers may lead to a reduction of the expected bandwidth.

The nonsymmetrical deposition has been found to have various causes which each individually or in combination can detrimentally influence the optical properties of the manufactured optical fiber. If during the movement of the resonant cavity for generating the plasma the glass tube is not in the center of the resonant cavity throughout its length, a rotationally nonsymmetrical plasma distribution will occur in the tube. The glass tube may have imperfections which may also result in a nonuniform deposition of the glass layers. These imperfections may be that the tube is not completely straight, or the tube does not have the same outside or inside diameter throughout its length. Furthermore, imperfections in the furnace may lead to a nonuniform heating.

Preventing or reducing the disadvantages of a rotationally nonsymmetrical deposition of the glass layers by continuous rotation of the glass tube during the deposition as used, for example, in the above-mentioned M.C.V.D. process, meets with a number of disadvantages in the present P.C.V.D. process. These disadvantages are related to the differences in performing the processes.

The M.C.V.D. process is usually carried out at pressures about equal to atmospheric pressure or greater than atmospheric pressure. Leakage in the rotation coupling used does not result in leaking-in of the ambient atmosphere into the glass tube. In contrast, the P.C.V.D. process is carried out at lower than atmospheric pressure. If the rotational coupling is not completely sealed from the atmosphere, the ambient atmosphere is drawn into the tube with all the resulting detrimental disadvantages. These disadvantages include, for example, an increase of the attenuation by incorporation of water in the glass layers which are formed in the tube. Detrition products originating from the rotating parts of the coupling can also be drawn into the tube and can also detrimentally influence the properties of the optical fiber.

An adequate rotational seal which can be used continuously without the described disadvantages is difficult to realize in practice. The consideration should be taken into account that already extremely small quantities of impurities (on the order of 0.1 ppm) may give rise to a noticeable increase in the attenuation (on the order of 1 db) in the optical fiber.

SUMMARY OF THE INVENTION

It is an object of the invention to reduce the rejects in optical fibers manufactured on a factory scale by the nonisothermal P.C.V.D. process and to ensure a uniform, good optical quality as much as possible.

According to the method of the invention, the glass tube is connected to a gas supply system and to a vacuum pump via flexible tubing. During the deposition of the glass layers, the glass tube is rotated, each time the direction of movement of the plasma in the tube is reversed, over an angle equal to 360°/n, where n is an integer larger than or equal to 2. Rotation continues until the tube has been rotated through at least 360°. After the tube is rotated through 360°, the direction of rotation is reversed. This process is repeated until all the glass layers have been deposited.

In practice it has been found that a considerable improvement of the optical properties of the resulting fiber can be obtained with comparitively small values of n by means of the stepwise rotation according to the invention. In particular, the bandwidth is significantly favorably influenced. If an asymmetric deposition pattern would occur in a stationary tube, in the method according to the invention the asymmetric deposition pattern would be symmetrically distributed over the circumference of the tube over a number of successive layers. During the heating at higher temperature (following the deposition) for contracting and collapsing the tube to form a solid preform, and during drawing the fiber therefrom, a further equalization of the deposition pattern is produced by diffusion between the layers.

Suitable values of n are equal to an integer from 2 to 12, preferably smaller than 10.

The flexible tubing may consist, for example, of a reinforced hose of a synthetic resin. The tube should be one which can be reeled and which can withstand the gas mixture which is passed through the tube at the operating temperature. Corrugated stainless steel, for example a Cr-Ni-Fe steel, which is not chemically attacked by the gas mixture, are preferably used.

The invention also relates to a device for carrying out the method. This device for providing glass layers on the inside of a glass tube comprises a gas supply device which is connected to one end of the glass tube, a furnace for heating the glass tube, a resonant cavity for generating a plasma in the glass tube, and means to reciprocate the resonant cavity along the glass tube. A high-frequency generator is connected to the resonant cavity, and a vacuum pump which is connected to the other end of the glass tube.

According to the invention the means for connecting the gas supply device and the vacuum pump, respectively, to the ends of the glass tube consists of flexible tubing. Means are provided for stepwise rotating the glass tube over a previously selected angle each time the movement of the resonant cavity along the tube is reversed.

In an embodiment of the invention which has proved suitable in practice, the means for rotating the glass tube over a previously adjusted angle consists of an electronic control unit or a stepping motor. The control unit or motor is coupled to a rotatable shaft which is arranged parallel to the tube. Two pulleys are present on the shaft. The pulleys transmit movement of the shaft to the glass tube via endless chains or belts via pulleys coupled to the glass tube.

The stepping motor is actuated via a control device. The control device switches on the motor when the resonant cavity is at the reversal points of its movement. All this can be established and controlled by electronic, optical or mechanical transducers.

BRIEF DESCRIPTION OF THE DRAWING

FIGS. 2A and 2B schematically show details of tube guide means in the device according to the invention.

DESCRIPTION OF THE PREFERRED EMBODIMENTS

Figure 1:
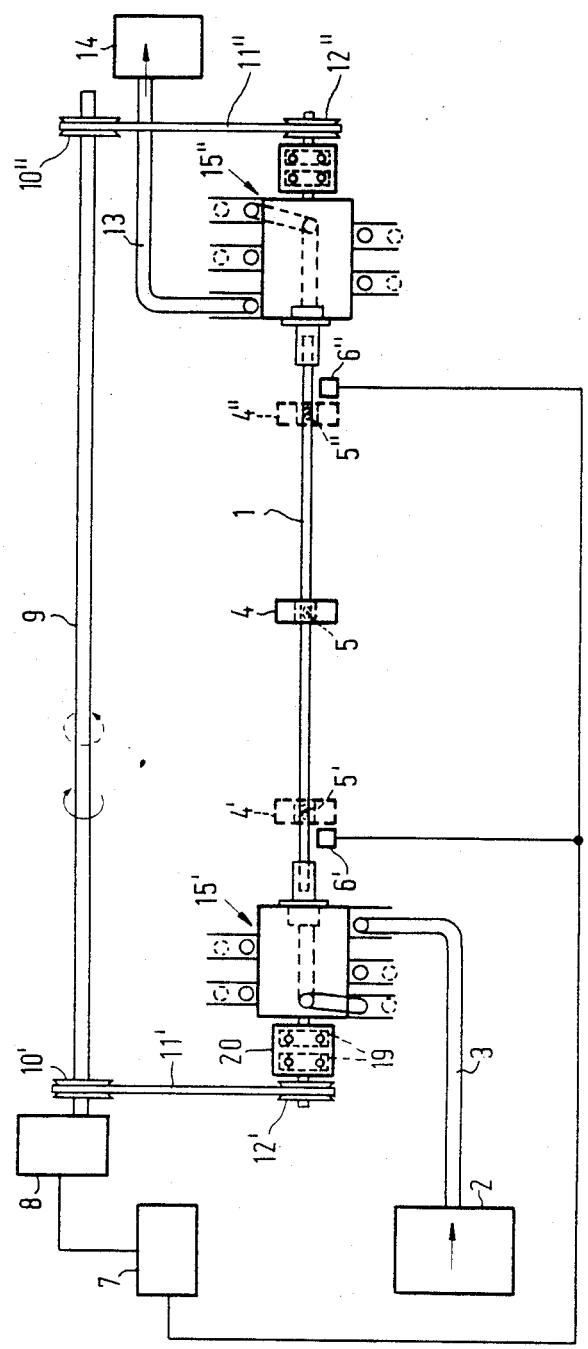
FIG. 1 schematically shows a device for providing glass layers on the inside of a glass tube according to the invention.

A gas mixture is passed through a tube 1 of quartz glass (fused silica) from a gas supply device 2 via a flexible tubing 3. The gas mixture has such a composition that it forms glass layers on the wall of the glass tube under the influence of a nonisothermal plasma. The gas mixture may consist, for example, of a mixture of silicon tetrachloride ($SiCl_4$) and oxygen, and may further comprise a dopant in a constant or varying quantity. The dopant may be, for example, a volatile hydrogen-free fluorine compound and/or germanium tetrachloride.

The tubing 3 may consist, for example, of corrugated stainless steel having a wall thickness of 0.1 mm. A resonant cavity 4 for generating the nonisothermal plasma 5 in the tube 1 is reciprocated past the tube 1 (movement means not shown). The resonant cavity is connected to a high-frequency generator (not shown). The extreme positions of the resonant cavity 4 and the plasma 5 are denoted by 4', 5' and 4", 5", respectively. These positions are the ends of the deposition zone. When the position 4' or 4" is reached, a signal is transmitted, via an electrical or mechanical transducer 6' or 6", to a control device 7 which is connected to a stepping motor 8.

The stepping motor 8 actuates a rod 9 on which two pulleys 10' and 10" are present. Via chains 11' and 11", rod a drives two pulleys 12' and 12". Pulleys 12' and 12 are provided on the shaft of the tubing guide means 15' and 15".

Each time when the resonant cavity 4 reaches either of the extreme positions 4' and 4", a signal is transmitted to the control device 7. The control device 7 in turn switches on the stepping motor when a signal from one of the transducers 6' and 6" is received. The stepping motor 8 rotates the rod 9 over a previously selected angle, 360°/n, as a result of which the tube 1 is also rotated over this angle.

The tube 1 is also connected to a vacuum pump 14 via a flexible tubing 13. Tubing 13 consists of the same material as tubing 3.

During the deposition process a furnace 30, which heats the tube 1 at a temperature between 1100° and 1300° C., is present around the tube 1. The high-frequency generator and the movement means for the resonant cavity are not shown in FIG. 1 to avoid complexity in the drawing. At the onset of the deposition of the glass layers on the inside of the tube 1, the tubes 3 and 13 are reeled on guide means 15' and 15", respectively. Each time the stepping motor 8 is switched on by the control device 7 and the tube 1 is rotated over an angle 360°/n, the radius of curvature of the turns of the tubings 3 and 13 on the bellows guide means 15' and 15" is increased. The control device 7 is adjusted so that the direction of rotation of the stepping motor 8 is reversed after the stepping motor has been switched on at least n times. The radius of curvature of the turns of the tubings 3 and 13 on the bellows guide means 15' and 15" then decreases.

FIG. 2A schematically shows the guide means 15' (or 15") used in the device shown in FIG. 1 for reeling and unreeling a flexible tubing 3. (Like reference numerals have the same meanings as FIG. 1. Tube 3 may also be tube 13.)

The device comprises a cylinder 15. Present on the cylinder 15 is an upright edge 16 which bounds a helical groove 17. A flexible tubing 3, for example corrugated stainless steel, is reeled in the groove 17.

One possible extreme position is shown in FIG. 2A in solid lines. The tubing 3 is at the circumference of the cylindrical member 15. The other extreme position is shown in broken lines. This position is achieved after the cylinder has been rotated stepwise in that sense that the tubing 3 is unreeled from the cylinder 15, and the turns obtain a larger radius of curvature.

Cylinder 15 may be rotated by means of a shaft 18 which may be connected to an electrical control unit or a stepping motor. The shaft 18 is journalled (bearing 19) in a housing 20.

The upright edge 16 of cylinder 15 is so high that the tubing 3 cannot accidentally get out of the grooves 17. Ends 21 and 22 of the tubing 3 are hermetically connected to a gas supply device 2 (FIG. 1) and the glass tube 1, respectively. If the tubing serves to exhaust gases from the tube 1, the end 21 of the flexible tubing is connected to a vacuum pump 14.

FIG. 2B schematically shows another embodiment of guide means 15' and 15". (Like reference numerals have the same meanings as in the preceding FIGS. 1 and 2A). Each time the shaft 18 is rotated, a part of the flexible tubing 3 is unreeled from the bellows guide means 15'. Via the noose 23 (which is connected to a counterweight (not shown) via a wire 24 extending over a guide wheel (not shown)), the flexible tubing 3 is pulled aside during unreeling. When the bellows guide means 15' is rotated in the opposite sense, the tubing 3 is reeled in again.

When the method and the device according to the invention are used, optical fibers of uniform quality are produced, despite the fact that rotation is not carried out continuously but stepwise. Up to, on average, a doubling of the bandwidth was obtained by means of the method according to the invention.

What is claimed is:

1. A method of manufacturing an optical fiber from a glass tube having an inside wall, said method comprising the steps of:
    supplying a reactive gas mixture from a nonrotating reservoir;
    providing a fluid connection from the reservoir to the glass tube;
    providing guide means at least at the end of the glass tube receiving the gas mixture;
    passing the reactive gas mixture through the inside of the glass tube at a pressure between 0.13 and 13.33 kPa;
    heating the glass tube to a temperature between 1100° and 1300° C.;
    forming a non-isothermal plasma in the gas mixture in a deposition zone in the tube in order to react the gases in the mixture and form glass on the inside wall of the tube;
    moving the plasma in a direction along the glass tube between a first end of a deposition zone and a second end of the deposition zone;
    reversing the direction of movement of the plasma each time the plasma reaches an end of the deposition zone; and
    then, after forming a number of layers of glass on the inside wall of the tube;
    collapsing the inner coated tube to form a solid rod; and
    drawing the solid rod into an optical fiber; wherein:
    the glass tube is rotated through an angle equal to 360°/n each time the plasma reaches an end of the deposition zone, where n is an integer greater than or equal to 2, the direction of rotation being reversed each time the glass tube is rotated through at least 360° C., said glass tube not rotating when the plasma is moving between the ends of the deposition zone; and
    the fluid connection is reeled or unreeled on said guide means as the direction of rotation of the glass tube is reversed.

2. A method as claimed in claim 1, wherein $2 \leq n \leq 12$.

3. A method as claimed in claim 2, wherein $n < 10$.

4. A method of manufacturing an optical fiber from a glass tube having an inside wall, said method comprising the steps of:
    supplying a reactive gas mixture from a nonrotating reservoir;
    providing a flexible tubing for connecting the reservoir to a first end of the glass tube;
    providing a flexible tubing for connecting a vacuum pump to a second end of the glass tube;
    providing first and second guide means at said first and second ends of the tube, respectively;
    passing the reactive gas mixture through the inside of the glass tube at a pressure between 0.13 and 13.33 kPa;
    heating the glass tube to a temperature between 1100° and 1300° C.;
    forming a non-isothermal plasma in the gas mixture in a deposition zone in the tube in order to react the gases in the mixture and form glass on the inside wall of the tube;
    moving the plasma in a direction along the glass tube between a first end of a deposition zone and a second end of the deposition zone;
    reversing the direction of movement of the plasma each time the plasma reaches an end of the deposition zone; and
    then, after forming a number of layers of glass on the inside wall of the tube:
    collapsing the inner coated tube to form a solid rod; and
    drawing the solid rod into an optical fiber; wherein:
    the glass tube is rotated through an angle equal to 360°/n each time the plasma reaches an end of the deposition zone, where n is an integer greater than or equal to 2, the direction of rotation being reversed each time the glass tube is rotated through at least 360°, said glass tube not rotating when the plasma is moving between the ends of the deposition zone; and
    the flexible tubing is wound or unwound on its respective guide means as the direction of rotation of the glass tube is reversed.

* * * * *